US012454642B2

(12) United States Patent
Zhou (10) Patent No.: US 12,454,642 B2
(45) Date of Patent: Oct. 28, 2025

(54) METAL OXIDE, METAL BRONZE AND POLYOXOMETALATE AS CHARGE STORAGE MATERIALS IN ELECTROCHROMIC DEVICE

(71) Applicant: LannRay Advanced Materials Co. LTD, Ningbo (CN)

(72) Inventor: Yan Zhou, Fremont, CA (US)

(73) Assignee: LannRay Advanced Materials Co. LTD, Ningbo (CN)

( * ) Notice: Subject to any disclaimer, the term of this patent is extended or adjusted under 35 U.S.C. 154(b) by 0 days.

(21) Appl. No.: 18/502,385

(22) Filed: Nov. 6, 2023

(65) Prior Publication Data

US 2024/0084193 A1    Mar. 14, 2024

Related U.S. Application Data

(63) Continuation of application No. 17/467,791, filed on Sep. 7, 2021, now Pat. No. 11,859,130, which is a continuation of application No. 16/505,316, filed on Jul. 8, 2019, now Pat. No. 11,142,682.

(60) Provisional application No. 62/699,382, filed on Jul. 17, 2018.

(51) Int. Cl.
  *C09K 9/00*   (2006.01)
(52) U.S. Cl.
  CPC ...................... *C09K 9/00* (2013.01)
(58) Field of Classification Search
  CPC .................. C09K 9/00; G02F 1/1514
  See application file for complete search history.

(56) References Cited

U.S. PATENT DOCUMENTS

| | | | |
|---|---|---|---|
| 4,630,176 A * | 12/1986 | Cuellar | H01G 11/34 361/502 |
| 5,442,478 A | 8/1995 | Lampert et al. | |
| 5,471,337 A | 11/1995 | Babinec | |
| 5,671,082 A | 9/1997 | Babinec | |
| 6,266,177 B1 | 7/2001 | Allemand et al. | |
| 9,975,989 B2 | 5/2018 | Mei et al. | |
| 2002/0118436 A1 | 8/2002 | Lomprey et al. | |
| 2002/0165405 A1 | 11/2002 | Peng et al. | |
| 2016/0126576 A1 * | 5/2016 | Martin | H01M 8/188 429/498 |
| 2017/0031224 A1 | 2/2017 | Gil et al. | |
| 2017/0299932 A1 | 10/2017 | Wang et al. | |
| 2018/0164650 A1 | 6/2018 | Garcia et al. | |

(Continued)

FOREIGN PATENT DOCUMENTS

| | | |
|---|---|---|
| CN | 1077999 A | 11/1993 |
| CN | 103186004 A | 7/2013 |
| CN | 108279540 A | 7/2018 |

(Continued)

OTHER PUBLICATIONS

European Search Report for Application No. 19185954.5, mailed on Nov. 29, 2019, 7 pages.

*Primary Examiner* — Khanh T Nguyen
(74) *Attorney, Agent, or Firm* — Sheppard Mullin Richter & Hampton LLP (57) ABSTRACT

This disclosure relates generally to solution processed low temperature metal oxide, metal bronze or polyoxometalate materials as charge storage material used in electrochromic devices, charge storage material and electrochromic devices comprising the materials and methods of making and using the same.

18 Claims, 4 Drawing Sheets

(56) References Cited

U.S. PATENT DOCUMENTS

2019/0219883 A1    7/2019   Kim et al.

FOREIGN PATENT DOCUMENTS

| WO | WO 2015160829 A1 * | 10/2015 | ............. B05D 3/108 |
| WO | WO 2017007607 A1 * | 1/2017  | ............... C09K 9/00 |

* cited by examiner

METAL OXIDE, METAL BRONZE AND POLYOXOMETALATE AS CHARGE STORAGE MATERIALS IN ELECTROCHROMIC DEVICE

CROSS-REFERENCE TO RELATED APPLICATIONS

This application is a continuation of U.S. patent application Ser. No. 17/467,791, filed on Sep. 7, 2021, which is a continuation application of U.S. patent application Ser. No. 16/505,316, filed on Jul. 8, 2019. The U.S. patent application Ser. No. 16/505,316 claims priority to U.S. provisional patent application No. 62/699,382 filed on Jul. 17, 2018, and entitled "Metal Oxide, Metal Bronze and Polyoxometalate as Charge Storage Materials in Electrochromic Device." All of the above-identified applications are incorporated herein by reference in their entirety.

FIELD

The disclosure relates generally to materials useful for charge storage (or described as counter electrode material) used in electrochromic devices, charge storage and electrochromic devices comprising the materials and methods of making and using the same.

BACKGROUND

Figure 1:
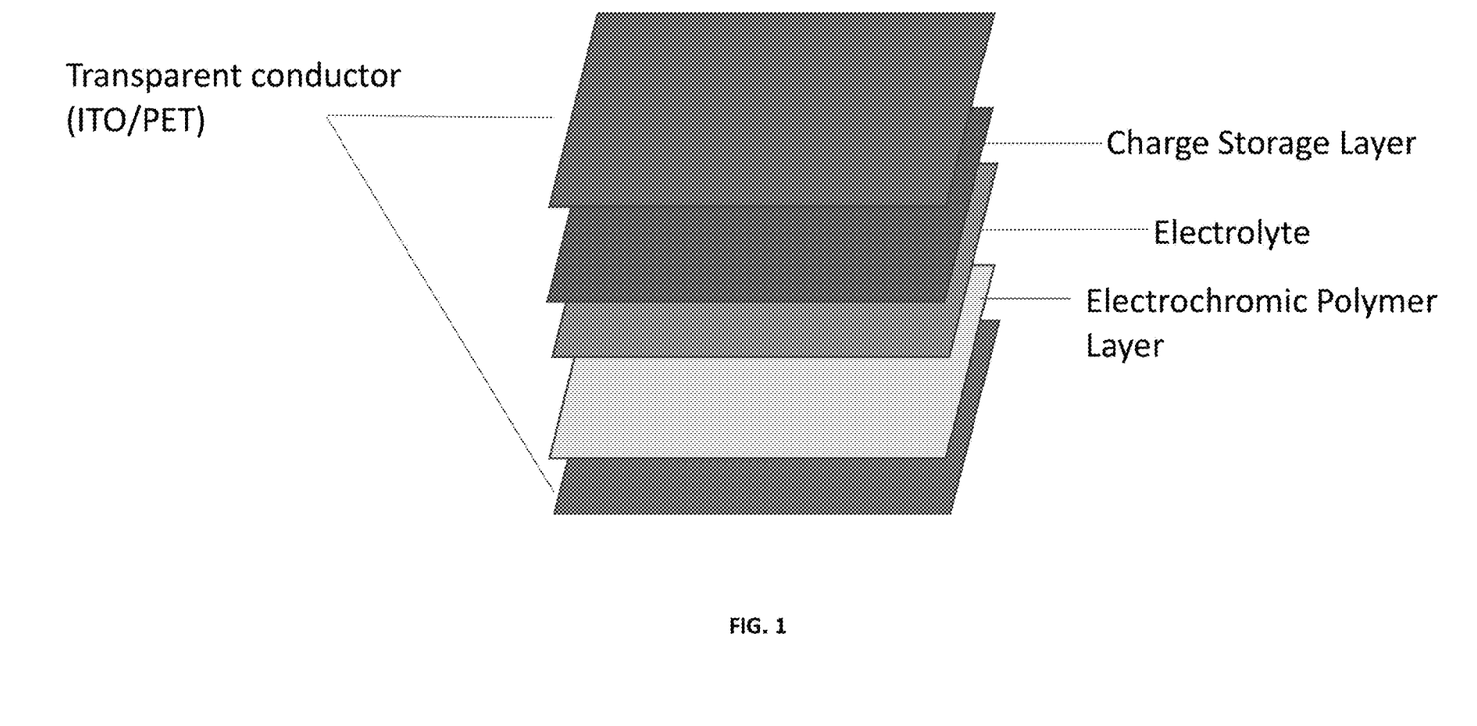
FIG. 1 is a simplified schematic illustration of an electrochromic device having an electrochromic layer, electrolyte layer and charge storage layer.

Electrochromic materials can change the transmittance, reflectance, absorptance or emittance under the action of electrical charge injection and extraction. The electrochromic films based on flexible substrates have advantages over the traditional electrochromic glasses in terms of weight, ease of transportation, ability to apply on curved surface, etc. In typical electrochromic devices, there are three layer of active material and two electrodes. Electrochromic layer, electrolyte layer and charge storage layer are sandwiched in between to transparent electrodes as illustrated in FIG. 1.

A need exists to develop new and/or improved materials for the charge storage layers, in particular those used in electrochromic films based on flexible substrates.

SUMMARY

The present disclosure is directed to use of solution processed low temperature metal oxide, solution processed low temperature metal bronze or solution processed low temperature polyoxometalate as a charge storage material of an electrochromic device. The form of the materials including nanoparticles and films.

The present disclosure is also directed to a charge storage material of a electrochromic device comprising metal oxide, metal bronze or polyoxometalate, and a electrochromic device comprising the charge storage material.

In some embodiments, the metal oxide comprises an oxide of titanium (Ti), vanadium (V), niobium (Nb), zirconium (Zr), molybdenum (Mo), nickel (Ni), copper (Cu) and chromium (Cr), or a mixture thereof. In some embodiments, metal oxide comprises an oxide of aluminum (Al) or silicon (Si), or a combination thereof. In some embodiments, the metal bronze is a hydrogen metal oxide wherein the metal is one or more of titanium (Ti), vanadium (V), niobium (Nb), zirconium (Zr), and molybdenum (Mo). In some embodiments, the polyoxometalate is an inorganic anion comprising oxygen and a metal such as one or more of titanium (Ti), vanadium (V), niobium (Nb), zirconium (Zr), and molybdenum (Mo).

In some embodiments, the metal oxide, metal bronze or polyoxometalate is a hydrate.

In some embodiments, the metal oxide, metal bronze or polyoxometalate is in an amorphous form.

In some embodiments, the metal oxide, metal bronze or polyoxometalate is in nanoparticle form.

In some embodiments, the metal oxide is one or more of
  $V_{y1}Ti_{y2}O_x \cdot nH_2O$ wherein the ratio of y1 to y2 is from about 1:1 to about 50:1, y1+y2 is 1,
  $V_{y1}Si_{y2}O_x \cdot nH_2O$ wherein the ratio of y1 to y2 is from about 1:1 to about 50:1, y1+y2 is 1,
  $V_{y1}Al_{y2}O_x \cdot nH_2O$ wherein the ratio of y1 to y2 is from about 1:1 to about 50:1, y1+y2 is 1,
  $V_{y1}Mo_{y2}O_x \cdot nH_2O$ wherein the ratio of y1 to y2 is from about 1:1 to about 50:1, y1+y2 is 1,
  $V_{y1}Nb_{y2}O_x \cdot nH_2O$ wherein the ratio of y1 to y2 is from about 1:1 to about 50:1, y1+y2 is 1,
  $V_{y1}Zr_{y2}O_x \cdot nH_2O$ wherein the ratio of y1 to y2 is from about 1:1 to about 50:1, y1+y2 is 1,
  and $V_{y1}Ti_{y2}Al_{y3}O_x \cdot nH_2O$, wherein the ratio of y1 to y2 is from about 1:1 to about 50:1, the ratio of y2 to y3 is from about 50:1 to about 1:50, and the ratio of y1 to y3 is from about 1:1 to about 50:1, y1+y2+y3=1,
  and a tri, tetra metal oxide mixture, and its pure form of oxide,
  wherein x is from about 2 to about 2.75, and n is from about 0 to about 2.

In some other embodiments, the metal oxide is one or more of
  $V_{y1}Ti_{y2}O_x \cdot nH_2O$ wherein the ratio of y1 to y2 is from about 1:10 to about 50:1, y1+y2 is 1,
  $V_{y1}Si_{y2}O_x \cdot nH_2O$ wherein the ratio of y1 to y2 is from about 1:10 to about 50:1, y1+y2 is 1,
  $V_{y1}Al_{y2}O_x \cdot nH_2O$ wherein the ratio of y1 to y2 is from about 1:10 to about 50:1, y1+y2 is 1,
  $V_{y1}Mo_{y2}O_x \cdot nH_2O$ wherein the ratio of y1 to y2 is from about 1:10 to about 50:1, y1+y2 is 1,
  $V_{y1}Nb_{y2}O_x \cdot nH_2O$ wherein the ratio of y1 to y2 is from about 1:10 to about 50:1, y1+y2 is 1,
  $V_{y1}Zr_{y2}O_x \cdot nH_2O$ wherein the ratio of y1 to y2 is from about 1:10 to about 50:1, y1+y2 is 1,
  and $V_{y1}Ti_{y2}Al_{y3}O_x \cdot nH_2O$, wherein the ratio of y1 to y2 is from about 1:10 to about 50:1, the ratio of y2 to y3 is from about 50:1 to about 1:50, and the ratio of y1 to y3 is from about 1:10 to about 50:1, y1+y2+y3=1,
  and a tri, tetra metal oxide mixture, and its pure form of oxide,
  wherein x is from about 2 to about 2.75, and n is from about 0 to about 2.

In still some other embodiments, the metal oxide is one or more of
  $V_{y1}Ti_{y2}O_x \cdot nH_2O$ wherein the ratio of y1 to y2 is about 1:2, y1+y2 is 1,
  $V_{y1}Si_{y2}O_x \cdot nH_2O$ wherein the ratio of y1 to y2 is about 1:2, y1+y2 is 1,
  $V_{y1}Al_{y2}O_x \cdot nH_2O$ wherein the ratio of y1 to y2 is about 1:2, y1+y2 is 1,
  $V_{y1}Mo_{y2}O_x \cdot nH_2O$ wherein the ratio of y1 to y2 is about 1:2, y1+y2 is 1,
  $V_{y1}Nb_{y2}O_x \cdot nH_2O$ wherein the ratio of y1 to y2 is about 1:2, y1+y2 is 1,
  $V_{y1}Zr_{y2}O_x \cdot nH_2O$ wherein the ratio of y1 to y2 is about 1:2, y1+y2 is 1, and $V_{y1}Ti_{y2}Al_{y3}O_x \cdot nH_2O$, wherein the ratio of y1 to y2 is about 1:2, the ratio of y2 to y3 is from about 50:1 to about 1:50, and the ratio of y1 to y3 is about 1:2, y1+y2+y3=1, and a tri, tetra metal oxide mixture, and its pure form of oxide, wherein x is from about 2 to about 2.75, and n is from about 0 to about 2.

In some embodiments, provided is a method of preparing the metal oxide, metal bronze or polyoxometalate. In some embodiments, the metal oxide, metal bronze or polyoxometalate is prepared from a metal alkoxide. In some embodiments, the method comprises mixing a metal alkoxide in a solvent such as an alcohol solvent. In some embodiments, the method further comprises coating the solution on a substrate to form a wet layer, and letting the wet layer dry under ambient conditions to form a dried metal oxide layer. In some embodiments, the method further comprises drying the dried metal oxide layer at a temperature of below about 150° C., to form a high performance charge storage material.

Other objects, features and advantages of the described preferred embodiments will become apparent to those skilled in the art from the following detailed description. It is to be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION

In the following description, certain specific details are set forth in order to provide a thorough understanding of various embodiments of the invention. However, one skilled in the art will understand that the invention may be practiced without these details. Moreover, while various embodiments of the invention are disclosed herein, many adaptations and modifications may be made within the scope of the invention in accordance with the common general knowledge of those skilled in this art. Such modifications include the substitution of known equivalents for any aspect of the invention in order to achieve the same result in substantially the same way.

Unless defined otherwise, all technical and scientific terms used herein have the same meaning as is commonly understood by one of skill in the art to which this invention belongs.

As used herein, the term "comprising" is intended to mean that the compositions and methods include the recited elements, but not excluding others. "Consisting essentially of" when used to define compositions and methods, shall mean excluding other elements of any essential significance to the combination. For example, a composition consisting essentially of the elements as defined herein would not exclude other elements that do not materially affect the basic and novel characteristic(s) of the claimed invention. "Consisting of" shall mean excluding more than trace amount of other ingredients and substantial method steps recited. Embodiments defined by each of these transition terms are within the scope of this invention.

Numeric ranges are also inclusive of the numbers defining the range. Additionally, the singular forms "a", "an" and "the" include plural referents unless the context clearly dictates otherwise.

Reference throughout this specification to "one embodiment," "an embodiment" or "some embodiments" means that a particular feature, structure or characteristic described in connection with the embodiment is included in at least one embodiment of the present invention. Thus, the appearances of the phrases "in one embodiment," "in an embodiment" or "in some embodiments" in various places throughout this specification are not necessarily all referring to the same embodiment or embodiments, but may be in some instances. Furthermore, the particular features, structures, or characteristics may be combined in any suitable manner in one or more embodiments.

The term "about" when used before a numerical value indicates that the value may vary within reasonable range, such as ±10%, ±5%, and ±1%.

"Alkyl" refers to a straight or branched hydrocarbon chain radical consisting solely of carbon (C) and hydrogen (H) atoms, which is saturated or unsaturated (i.e., contains one or more double and/or triple bonds), having from 1 to 30 carbon atoms ($C_1$-$C_{30}$ alkyl), and which is attached to the rest of the molecule by a single bond, e.g., methyl, ethyl, n-propyl, 1-methylethyl (iso-propyl), n-butyl, n-pentyl, 1,1-dimethylethyl (t-butyl), 3-methylhexyl, 2-methylhexyl, ethenyl, prop-1-enyl, but-1-enyl, pent-1-enyl, penta-1,4-dienyl, ethynyl, propynyl, butynyl, pentynyl, hexynyl, and the like. Unless stated otherwise specifically in the specification, an alkyl group may be optionally substituted. In some embodiments, alkyl is a straight or branched hydrocarbon chain radical having 1 to 20 carbon atoms ($C_1$-$C_{20}$ alkyl), 1 to 10 carbon atoms ($C_1$-$C_{10}$ alkyl), 1 to 6 carbon atoms ($C_1$-$C_6$ alkyl), or 1 to 4 carbon atoms ($C_1$-$C_4$ alkyl).

"Hydrate" refers to a complex formed by combining water molecules with molecules of a compound, such as a metal oxide, metal bronze or polyoxometalate.

"Optional" or "optionally" means that the subsequently described event of circumstances may or may not occur, and that the description includes instances where said event or circumstance occurs and instances in which it does not. For example, "optionally substituted alkyl" means that the alkyl radical may or may not be substituted and that the description includes both substituted alkyl radicals and alkyl radicals having no substitution.

In some embodiments, provided herein are metal oxides, metal bronzes or polyoxometalates prepared under low temperature that are useful as charge storage materials in electrochromic devices. In some embodiments, the low temperature metal oxides, metal bronzes or polyoxometalates are prepared at a temperature below 150° C. In a flexible electrochromic device, processing temperature of all three layers (electrochromic layer, electrolyte layer and charge storage layer) cannot exceed the glass transition temperature of the plastic substrate materials. In some embodiment, the processing temperature is below 150° C. Providing low temperature solution processable materials is crucially important in order to achieve low cost flexible electrochromic films. Low temperature processable metal oxide, polyoxometalate, or metal bronze as the efficient charge storage materials could significant reduce the processing difficulty of a flexible electrochromic device. Further, the materials are transparent in the visible range and do not exhibit major color changes when changing from clear state to opaque state and vice versa, and therefore they do not interfere significantly with the electrochromic layer. In some embodiments, the charge storage materials described herein are at least about 70% transparent in visible light range. The transparency measurement may be taken by a minolta photospectrometer such as CM-5. In some embodiments, the charge storage materials described herein are about 70% to 90% transparent. Preparation of such materials avoids use of high temperature or vacuum and therefore could also reduce the overall cost of the flexible electrochromic product.

In some embodiments, the metal oxide is one or more of $TiO_2$, NiO, $Nb_2O_5$, $WO_3$, NiO, $V_2O_5$, $MoO_3$, CoO, $MoO_2$, $Ni_2O_3$, $Co_2O_3$, $VO_x$, and $MoO_y$, etc., wherein x is from about 2 to about 2.5, and y is from about 2 to about 3, and any mixture from such metal oxide complexes or procurers, or polyoxometalates. In some embodiments, the metal oxides is of the formula $M^1_{y1}M^2_{y2}M^3_{y3}O_x$, wherein each $M^1$, $M^2$ and $M^3$ is independently a metal, such as Ti, Ni, Nb, W, V, Mo, Si, Zr, Al or Co, each y1, y2 and y3 is independently from 0 to 100, provided that at least one of y1, y2 and y3 is not 0, and x is from 1 to 100. In some embodiments, each y1, y2 and y3 is independently from 0 to 50, or 0 to 20, or 0 to 10, provided that at least one of y1, y2 and y3 is not 0. In some embodiments, x is from 1.5 to 3, each y1, y2, y3 is independently 0 to 1, provided that y1+y2+y3 is 1.

In some embodiments, the metal oxide is a hydrate. In some embodiments, the metal oxides is of the formula $M^1_{y1}M^2_{y2}M^3_{y3}O_x \cdot nH_2O$, wherein each $M^1$, $M^2$ and $M^3$ is independently a metal, such as Ti, Ni, Nb, W, V, Mo, Si, Zr, Al or Co, x is from 1.5 to 3, each y1, y2 and y3 is independently from 0 to 1, provided that y1+y2+y3=1, and n is from 0.001 to 3.

In some embodiments, the metal oxide is one or more of
$V_{y1}Ti_{y2}O_x \cdot nH_2O$ wherein the ratio of y1 to y2 is from about 1:1 to about 50:1,
$V_{y1}Si_{y2}O_x \cdot nH_2O$ wherein the ratio of y1 to y2 is from about 1:1 to about 50:1,
$V_{y1}Al_{y2}O_x \cdot nH_2O$ wherein the ratio of y1 to y2 is from about 1:1 to about 50:1,
$V_{y1}Mo_{y2}O_x \cdot nH_2O$ wherein the ratio of y1 to y2 is from about 1:1 to about 50:1,
$V_{y1}Nb_{y2}O_x \cdot nH_2O$ wherein the ratio of y1 to y2 is from about 1:1 to about 50:1,
$V_{y1}Zr_{y2}O_x \cdot nH_2O$ wherein the ratio of y1 to y2 is from about 1:1 to about 50:1,
and $V_{y1}Ti_{y2}Al_{y3}O_x \cdot nH_2O$, or other tri, tetra metal oxide mixture, or its pure form of oxide, wherein the ratio of y1 to y2 is from about 1:1 to about 50:1, the ratio of y2 to y3 is from about 50:1 to about 1:50, the ratio of y1 to y3 is from about 1:1 to about 50:1,
wherein x is from about 2 to about 2.75, y1+y2 is about 1 or y1+y2+y3 is about 1, and n is from about 0 to about 3. In some embodiments, the ratio of y1 to y2 is from about 1:1 to about 40:1, or from about 1:1 to about 30:1, or from about 1:1 to about 20:1, or from about 1:1 to about 10:1, or from about 1:1 to about 5:1, or from about 1:10 to about 50:1, or from about 10:1 to about 50:1, or from about 10:1 to about 40:1, or from about 10:1 to about 30:1, or from about 10:1 to about 20:1, or from about 20:1 to about 50:1, or from about 20:1 to about 40:1, or from about 20:1 to about 30:1, or from about 30:1 to about 50:1, or from about 30:1 to about 40:1. In some other embodiments, the ratio of y1 to y2 is about 1:2. In some embodiments, the ratio of y1 to y3 is from about 1:1 to about 40:1, or from about 1:1 to about 30:1, or from about 1:1 to about 20:1, or from about 1:1 to about 10:1, or from about 1:1 to about 5:1, or from about 1:10 to about 50:1, or from about 10:1 to about 50:1, or from about 10:1 to about 40:1, or from about 10:1 to about 30:1, or from about 10:1 to about 20:1, or from about 20:1 to about 50:1, or from about 20:1 to about 40:1, or from about 20:1 to about 30:1, or from about 30:1 to about 50:1, or from about 30:1 to about 40:1. In some other embodiments, the ratio of y1 to y3 is about 1:2. In some embodiments, the ratio of y2 to y3 is from about 40:1 to about 1:50, or from about 40:1 to about 1:40, or from about 40:1 to about 1:30, or from about 40:1 to about 1:20, or from about 40:1 to about 1:10, or from about 40:1 to about 1:1, or from about 40:1 to about 10:1, or from about 40:1 to about 20:1, or from about 40:1 to about 30:1, or from about 30:1 to about 1:50, or from about 30:1 to about 1:40, or from about 30:1 to about 1:30, or from about 30:1 to about 1:20, or from about 30:1 to about 1:10, or from about 30:1 to about 1:1, or from about 30:1 to about 10:1, or from about 30:1 to about 20:1, or from about 20:1 to about 1:50, or from about 20:1 to about 1:40, or from about 20:1 to about 1:30, or from about 20:1 to about 1:20, or from about 20:1 to about 1:10, or from about 20:1 to about 1:1, or from about 20:1 to about 10:1, or from about 10:1 to about 1:50, or from about 10:1 to about 1:40, or from about 10:1 to about 1:30, or from about 10:1 to about 1:20, or from about 10:1 to about 1:10, or from about 10:1 to about 1:1, or from about 1:1 to about 1:50, or from about 1:1 to about 1:40, or from about 1:1 to about 1:30, or from about 1:1 to about 1:20, or from about 1:1 to about 1:10, or from about 1:10 to about 1:50, or from about 1:10 to about 1:40, or from about 1:10 to about 1:30, or from about 1:10 to about 1:20, or from about 1:20 to about 1:50, or from about 1:20 to about 1:40, or from about 1:20 to about 1:30, or from about 1:30 to about 1:50, or from about 1:30 to about 1:40.

In some embodiments, the metal bronze (or hydrogen metal oxide bronze) is of the formula $H_zM^1_{y1}M^2_{y2}M^3_{y3}O_x$, wherein each $M^1$, $M^2$ and $M^3$ is independently a metal, such as Ti, Ni, Nb, W, V, Mo, Si, Zr, Al or Co, each y1, y2 and y3 is independently from 0 to 100, provided that at least one of y1, y2 and y3 is not 0, and each x and z is independently from 1 to 100. In some embodiments, each y1, y2 and y3 is independently from 0 to 50, or 0 to 20, or 0 to 10, provided that at least one of y1, y2 and y3 is not 0. In some embodiments, x is from 1 to 10, each y1, y2, y3 is independently 0 to 5, provided that y1+y2+y3 is 1 to 5, and z is 1 to 5. In some embodiments, x is from 1.5 to 6, each y1, y2, y3 is independently 0 to 2, provided that y1+y2+y3 is 1 to 3, and z is 1. In some embodiments, the metal bronze is $HMoO_{2.4}$, $HMoO_{2.75}$, $HMoO_{2.93}$, $HMoO_3$, $HV_2O_5$, or $HVO_{2.46}$.

Polyoxometalates are polyatomic ions, usually anions. In some embodiments, the polyoxometalate comprises two or more transition metal oxyanions linked together by shared oxygen atoms to form a closed 3-dimensional framework. In some embodiments, the polyoxometalate comprises three or more transition metal oxyanions linked together by shared oxygen atoms to form closed 3-dimensional frameworks. In some embodiments, each metal atom is independently a group 6 (e.g., Mo or W) or group 5 (e.g., V, Nb, or Ta) transition metal. In some embodiments, each metal atom is in its high oxidation state. In some embodiments, the polyoxometalate is an isopolymetalate, comprising only one kind of metal and oxide. In some embodiments, the polyoxometalate is a heteropolymetalate, comprising one metal, oxide, and a main group oxyanion (phosphate, silicate, etc.). In some embodiments, the polyoxometalate is a water-soluble fully inorganic early-transition metal-oxygen-anion clusters. In some embodiments, the polyoxometalate comprises an anion of the formula $[A_sM^1_{y1}M^2_{y2}M^3_{y3}O_x]^{m-}$, wherein A is P or Si, each $M^1$, $M^2$ and $M^3$ is independently a metal, such as Ti, Ni, Nb, W, V, Mo, Si, Zr, Al or Co, each y1, y2 and y3 is independently from 0 to 100, provided that at least one of y1, y2 and y3 is not 0, each s and x is independently from 1 to 100, and m is an integer of from 1 to 10. In some embodiments, each y1, y2 and y3 is independently from 0 to 50, or 0 to 20, or 0 to 10, provided that at least one of y1, y2 and y3 is not 0. In some embodiments, one, two or three of y1, y2 and y3 are integers. In some embodiments, A is P. In some embodiments, A is Si. In some embodiments, s is an integer. In some embodiments, s is 1, 2, 3, 4 or 5. In some embodiments, x is from 1 to 70. In some embodiments, x is an integer. In some embodiments, x is 40 or 62. In some embodiments, m is 1, 2, 3, 4, 5, 6, 7 or 8.

In some embodiments, the polyoxometalate comprises $[PW_{12}O_{40}]^{3-}$, $[PMo_{12}O_{40}]^{3-}$, $[P_2W_{18}O_{62}]^{6-}$, $[P_2Mo_{18}O_{62}]^{6-}$, $[Si_2Nb_6W_{18}O_{77}]^{8-}$, or $[SiNb_3W_9O_{40}]^{7-}$. In some embodiments, the polyoxometalate further comprises a cation, such as $H^+$, $Li^+$, $Na^+$, $K^+$, or $NH_4^+$. Examples of polyoxometalates include, but are not limited to, $H_3PW_{12}O_{40}$, $H_3PMo_{12}O_{40}$, $K_6P_2W_{18}O_{62}$, $(NH_4)_6P_2W_{18}O_{62}$, $(NH_4)_6P_2Mo_{18}O_{62}$, and $H_3PMoO_{40}$.

In some embodiments, the metal oxide, metal bronze or polyoxometalate is in an amorphous form.

In some embodiments, provided is a charge storage material of an electrochromic device comprising a metal oxide, metal bronze or polyoxometalate. The charge storage material described herein provide high performance.

In some embodiments, the charge storage material is in the form of a layer of a thin film (charge storage layer) comprising a metal oxide, metal bronze or polyoxometalate and their nanoparticle form described herein. In some embodiments, the thickness of the film is from about 10 nm to about 1000 nm, such as from about 20 nm to about 500 nm, from about 20 nm to about 200 nm, or about 20 nm, about 50 nm, about 100 nm, about 150 nm, or about 200 nm, or any range between any two of the numbers, end points inclusive.

In some embodiments, the charge storage material is in the form of nanoparticles. In some embodiments, the sizes of the nanoparticles are from about 1 nm to about 1000 nm, such as from about 10 nm to about 500 nm, from about 20 nm to about 200 nm, or about 10 nm to about 20 nm, about 50 nm, about 100 nm, about 150 nm, or about 200 nm, about 250 nm, about 500 nm, or any range between any two of the numbers, end points inclusive.

The present disclosure is also directed to an electrochromic device comprising a charge storage material described herein. Other components of electrochromic devices are generally known in the art.

In an electrochromic device, there are two set of materials, anode which is oxidized while apply positive voltage while driving the device, and cathode which is reducing. The metal oxide, metal bronze or polyoxometalate described herein can serve as either the anode or the cathode charge storage materials. In some embodiments, the solution processed low temperature metal oxide, metal bronze or polyoxometalate described herein can serve as either the anode or the cathode charge storage materials. In some embodiments, the electrochromic device further comprises an electrochromic polymer as described in U.S. Pat. No. 9,975,989, which is hereby incorporated by reference in its entirety.

In some embodiments, the electrochromic device comprising an electrochromic layer, electrolyte layer and charge storage layer as illustrated by FIG. 1, wherein the charge storage layer comprises the metal oxide, metal bronze or polyoxometalate described herein.

In some embodiments, provided is a method of preparing the metal oxide, metal bronze or polyoxometalate useful as a charge storage material in an electrochromic device. In some embodiments, solution processed low temperature metal oxide, metal bronze or polyoxometalate can be used as a charge storage material in an electrochromic device.

Metal oxides could be synthesized prior coating or during the coating process. In some embodiments, the precursor of the metal oxide, metal bronze or polyoxometalate is one or more metal alkoxide. In some embodiments, the metal alkoxide is of the structure $M(OR)_p$, wherein M is a metal, such as Ti, V, Nb, Zr, Mo, Ni, Cu, or Cr, or a mixture thereof, R is an alkyl group, and p is 1, 2, 3, 4, 5, or 6. In some embodiments, the R is $C_1$-$C_4$ alkyl, such as methyl, ethyl or isopropyl.

In some embodiments, the method comprises mixing a metal alkoxide in a solvent such as methanol, ethanol, iso-propanol, butanol, methoxyethanol to form a solution or suspension. In some embodiments, the method further comprises coating the solution or suspension on a substrate to form a wet layer. The metal alkoxide hydrolyzes to related metal oxide after being left under ambient conditions. In some embodiments, the method further comprises letting the wet layer dry under ambient conditions to form a dried metal oxide layer. In some embodiments, the method further comprises drying the dried metal oxide layer at a temperature of below about 150° C., to form a charge storage material. In some embodiments, the substrate is a flexible substrate and does not tolerate high temperatures.

In some embodiments, the method comprises forming a solution or suspension of nanoparticles of a metal oxide in a solvent, such as methanol, ethanol or isopropanol or water, forming a thin layer of the solution or suspension and then forming a solid film of the metal oxide by drying the thin layer of the solution or suspension.

In some embodiments, the method comprises oxidizing a metal in a solvent, such as methanol, ethanol or isopropanol, with an oxidation reagent, such as $H_2O_2$, to form a solution or suspension comprising the metal oxide, metal bronze or polyoxometalate. In some embodiments, the method further comprises forming a thin layer of the solution or suspension and then forming a solid film of the metal oxide, metal bronze or polyoxometalate by drying a thin layer of the solution or suspension.

In some embodiments, the methods described herein do not comprise a temperature that is higher than 150° C. In some embodiments, the methods described herein are conducted at an ambient temperature.

In some embodiments, provided are metal oxides, metal bronzes or polyoxometalates prepared by methods described herein which are useful as charge storage materials of electrochromic devices.

EXAMPLES

The present technology is further defined by reference to the following examples. It will be apparent to those skilled in the art that many modifications, both to compositions and methods, may be practiced without departing from the scope of the current disclosure.

Example 1: Titanium Oxide

Figure 2:
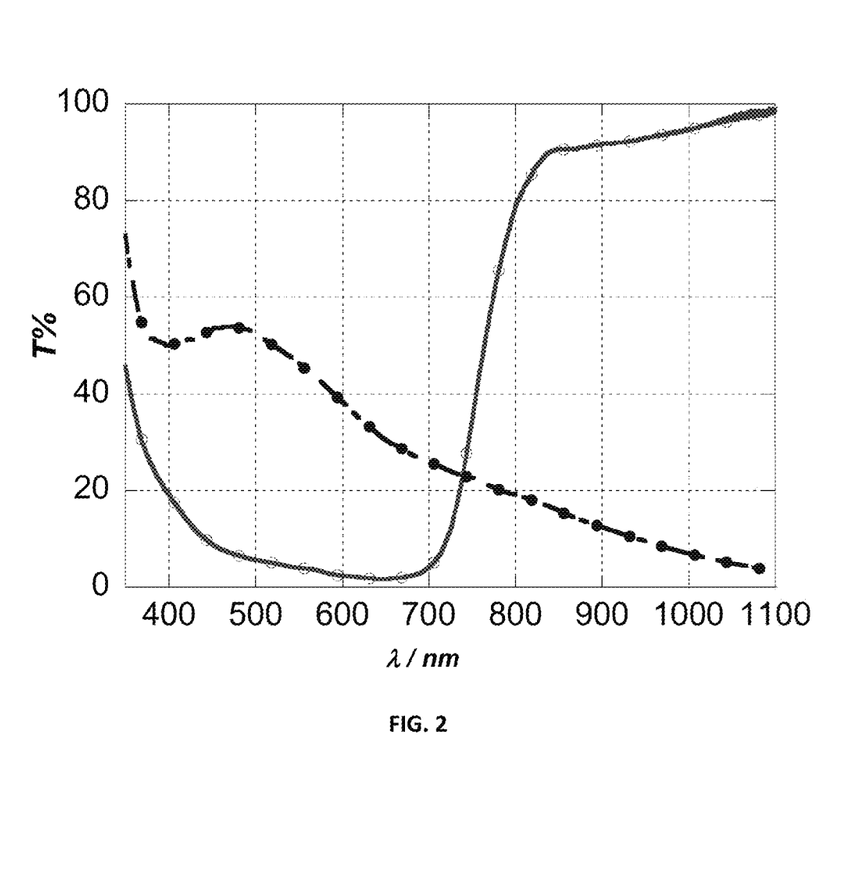
FIG. 2 shows absorption spectra of fully bleached (clear) and reversibly colorized (opaque) states of an electrochromic device with $TiO_2$ nanoparticles described in Example 1 as the charge storage material, according to some embodiments of the present specification. Filled circle and empty circle represent absorption spectra of the device in clear state and opaque state, respectively.

Such oxide material could be pre-synthesized, like $TiO_2$ nano-crystals, and dissolved or dispersed in a proper solvent. For example, 5 nm to 15 nm anatase $TiO_2$ nano-crystal dispersion in water was diluted into 10 mg/mL concentration. The solution was dispersed with a slot die coater to form a thin uniform film with 20 micrometer thick liquid layer. The resulted dried $TiO_2$ solid layer is about 200 nm thick. Such thin layer could be served as charge storage layer in cathode with an electrochromic polymer material as the anode. The electrolyte was described in US2017/0299932, which is hereby incorporated by reference in its entirety. The electrochromic polymer could be fully bleached at 2.1 V, and reversibly colorized at −1.0V. The absorption spectra of the two states are shown in FIG. 2.

Example 2: Molybdenum Oxide

Figure 3:
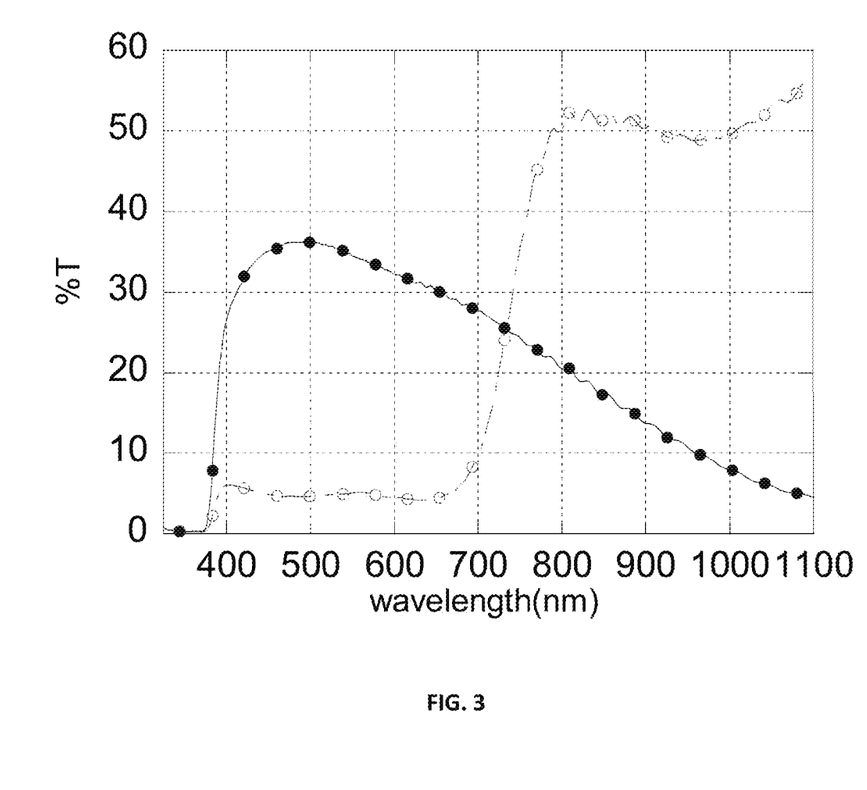
FIG. 3 shows absorption spectra of clear state and opaque state of an electrochromic device comprising a $MoO_3$ charge storage layer described in Example 2 as the charge storage material, according to some embodiments of the present specification. Filled circle and empty circle represent absorption spectra of the device in clear state and opaque state, respectively.

Metal oxide complex could be also formed during the film formation via reaction such as hydrolysis process. $Mo(OC_2H_5)_5$ with 1% weight ratio in ethanol was applied by a slot die coater, and form a solid film. The film was baked and assembled with an electrochromic polymer and electrolyte (e.g., those described in US2017/0299932) to form an active electrochromic device. Such device could be switched between opaque and clear with 1.5 V and −1 V. The absorption spectra are shown in FIG. 3.

Example 3: Polyoxometalate

Figure 4:
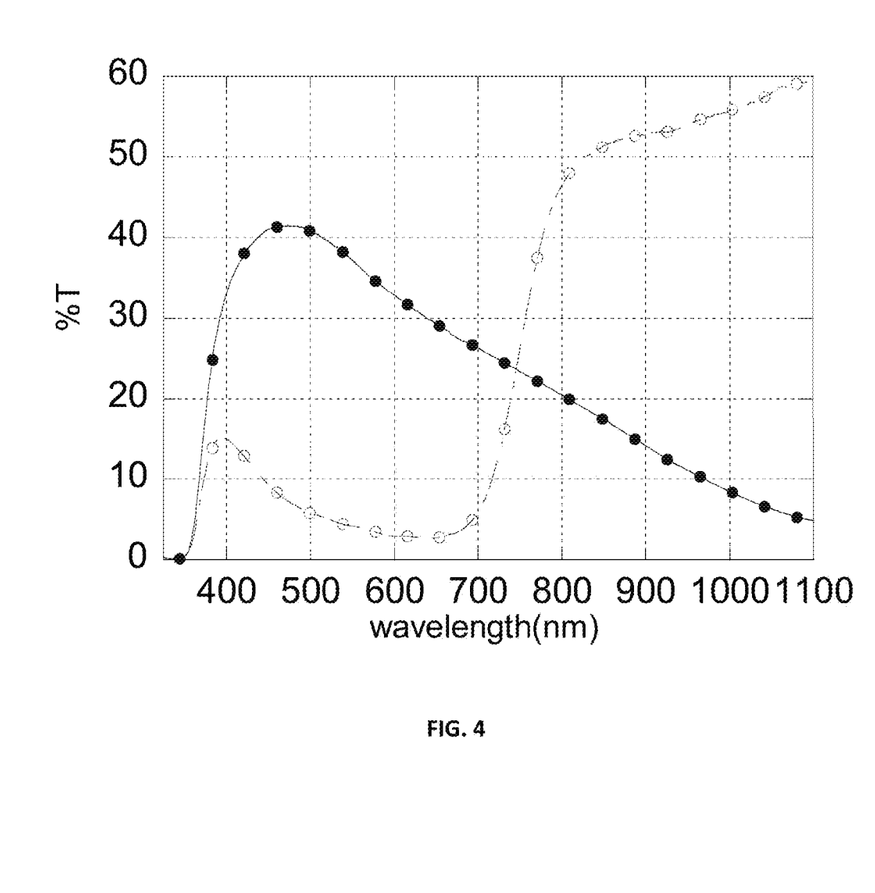
FIG. 4 shows absorption spectra of clear state and opaque state of an electrochromic device comprising a $H_zMoO_x$ (z is about 2 and x is about 2 to 4) charge storage layer described in Example 3 as the charge storage material, according to some embodiments of the present specification. Filled circle and empty circle represent absorption spectra of the device in clear state and opaque state, respectively.

Metal oxide or polyoxometalate could be synthesized as the metal bronze or solution. 1 g of Mo was added to 100 mL ethanol and then 3 mL of 30% $H_2O_2$ was added. The mixture was stirred overnight in room temperature to result a dark blue metal bronze solution. The solution was applied via a slot die coater to form a 100 nm solid film, the composition of such metal bronze material is suggested to be $HyMoOx$. Such film was assembled with electrochromic polymer and electrolyte to form an active device. Such device could be switched reversibly with 1.2V to −1V. The absorption spectra were shown in FIG. 4.

APPLICATIONS/USES

Embodiments of the charge storage materials comprising metal oxide, metal bronze or polyoxometalate disclosed herein may be used in various applications, devices, industries etc. For example, the charge storage materials may be configured for use in smart window and display technology, e.g., anti-glare car mirrors, smart windows configured to modulate the transmission or reflected solar radiation for use in cars, aircrafts, buildings, and the like; protective eyewear; camouflage and/or chameleonic materials; and other electrochromic devices.

The invention described and claimed herein is not to be limited in scope by the specific preferred embodiments disclosed herein, as these embodiments are intended as illustrations of several aspects of the invention. Indeed, various modifications of the invention in addition to those shown and described herein will become apparent to those skilled in the art from the foregoing description. Such modifications are also intended to fall within the scope of the appended claims.

What is claimed is:
1. An electrochromic device comprising:
a charge storage material comprising a polyoxometalate, wherein the polyoxometalate comprises an anion of a formula $[A_sM^1_{y1}M^2_{y2}M^3_{y3}O_x]^{m-}$, wherein:
A is P or Si,
each $M^1$, $M^2$ and $M^3$ is independently a metal selected from Ti, Ni, Nb, W, V, Mo, Si, Zr, Al or Co,
$M^1$, $M^2$ and $M^3$ are different metals,
each y1, y2 and y3 is independently from 0 to 100, provided that at least two of y1, y2 and y3 are not 0,
each s and x is independently from 1 to 100, and
m is an integer of from 1 to 10,
wherein the polyoxometalate is deposited as a solid thin film serving as a charge storage layer of the electrochromic device and is configured to reversibly store and release charges.
2. The electrochromic device of claim 1, wherein:
the polyoxometalate comprises $[Si_2Nb_6W_{18}O_{77}]^{8-}$, or $[SiNb_3W_9O_{40}]^{7-}$ or a mixture thereof.
3. The electrochromic device of claim 1, wherein the polyoxometalate further comprises:
a cation selected from $H^+$, $Li^+$, $Na^+$, $K^+$, or $NH_4^+$.
4. The electrochromic device of claim 1, wherein:
the polyoxometalate is in an amorphous form.
5. The electrochromic device of claim 1, wherein the polyoxometalate has a transparency of about 70% to about 90% within a visible spectrum, within which wavelengths range from about 380 nm to about 700 nm.
6. The electrochromic device of claim 1, wherein the polyoxometalate comprises two or more transition metal oxyanions linked together by shared oxygen atoms to form a closed 3-dimensional framework.
7. The electrochromic device of claim 1, wherein the polyoxometalate comprises three or more transition metal oxyanions linked together by shared oxygen atoms to form closed 3-dimensional frameworks.
8. The electrochromic device of claim 1, wherein the polyoxometalate is an isopolymetalate comprising only one kind of metal and oxide.
9. The electrochromic device of claim 1, wherein the polyoxometalate is a heteropolymetalate comprising metal, oxide, and a main group oxyanion selected from phosphate or silicate.
10. The electrochromic device of claim 1, wherein the polyoxometalate is a water-soluble fully inorganic early-transition metal-oxygen-anion clusters.
11. A charge storage material of an electrochromic device comprising:
a polyoxometalate, wherein the polyoxometalate comprises an anion of a formula $[A_sM^1_{y1}M^2_{y2}M^3_{y3}O_x]^{m-}$, wherein:

A is P or Si, each $M^1$, $M^2$ and $M^3$ is independently a metal selected from Ti, Ni, Nb, W, V, Mo, Si, Zr, Al or Co, $M^1$, $M^2$ and $M^3$ are different metals;

each y1, y2 and y3 is independently from 0 to 100, provided that at least two of y1, y2 and y3 are not 0, each s and x is independently from 1 to 100, and m is an integer of from 1 to 10, wherein the polyoxometalate is deposited as a solid thin film serving as a charge storage layer of the electrochromic device and is configured to reversibly store and release charges.

12. The charge storage material of claim 11, wherein:
the polyoxometalate comprises $[Si_2Nb_6W_{18}O_{77}]^{8-}$, or $[SiNb_3W_9O_{40}]^{7-}$ or a mixture thereof.

13. The charge storage material of claim 11, wherein the polyoxometalate further comprises:
a cation selected from $H^+$, $Li^+$, $Na^+$, $K^+$, or $NH_4^+$.

14. The charge storage material of claim 11, wherein:
the polyoxometalate is in an amorphous form.

15. The charge storage material of claim 11, wherein the polyoxometalate has a transparency of about 70% to about 90% within a visible spectrum, within which wavelengths range from between about 380 nm to about 700 nm.

16. The charge storage material of claim 11, wherein the polyoxometalate is an isopolymetalate comprising only one kind of metal and oxide.

17. The charge storage material of claim 11, wherein the polyoxometalate is a heteropolymetalate comprising metal, oxide, and a main group oxyanion selected from phosphate or silicate.

18. The charge storage material of claim 11, wherein the polyoxometalate is a water-soluble fully inorganic early-transition metal-oxygen-anion clusters.

* * * * *